(12) United States Patent
Levinson

(10) Patent No.: US 6,251,545 B1
(45) Date of Patent: Jun. 26, 2001

(54) METHOD AND SYSTEM FOR IMPROVING TRANSMISSION OF LIGHT THROUGH PHOTOMASKS

(75) Inventor: Harry J. Levinson, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/357,422

(22) Filed: Jul. 20, 1999

(51) Int. Cl.$^7$ ................................................ G03F 9/00
(52) U.S. Cl. ................................................................ 430/5
(58) Field of Search ............................. 430/5, 322, 323; 428/426

(56) References Cited

U.S. PATENT DOCUMENTS

| | | | |
|---|---|---|---|
| 5,279,911 | * | 1/1994 | Kamon et al. ............................ 430/5 |
| 5,422,206 | * | 6/1995 | Kamon ..................................... 430/5 |
| 5,780,161 | * | 7/1998 | Hsu ....................................... 428/426 |
| 5,879,866 | * | 3/1999 | Starikov et al. ......................... 430/5 |

OTHER PUBLICATIONS

"Characteristics of Deep UV Optics at 193nm & 157 nm," Glen P. Callahan and Bruce K. Flint 1998.

* cited by examiner

Primary Examiner—S. Rosasco
(74) Attorney, Agent, or Firm—Sawyer Law Group LLP

(57) ABSTRACT

The present invention provides a method and system for improving the transmission of light through a photomask. The method includes providing a photomask substrate, and applying at least one anti-reflection coating to at least one side of the photomask substrate. The anti-reflection coating reduces the loss of light during lithography due to reflections. This increases the efficiency of the lithography. The method and system has the added advantage of reducing the amount of undesired exposure of a photoresist.

10 Claims, 6 Drawing Sheets

METHOD AND SYSTEM FOR IMPROVING TRANSMISSION OF LIGHT THROUGH PHOTOMASKS

FIELD OF THE INVENTION

The present invention relates to semiconductor fabrication, and more particularly to lithography in semiconductor fabrication.

BACKGROUND OF THE INVENTION

Lithography is conventionally used in the fabrication of semiconductor devices. In optical lithography, a photosensitive film, a photoresist, is patterned by a photomask. The photomask has areas composed of chrome, or some other opaque or partially transmitting material, in a pattern which corresponds to the desired circuitry for the device. The photomasked photoresist is exposed to light from a light source. After exposure, the photomask is removed, leaving a photoresist with the desired pattern. An etch or implantation of the device's substrate may be performed based upon the photoresist pattern.

FIG. 1 illustrates a conventional photomask 110 and photoresist 130 as used in lithography. The photomask 110 may comprise fused silica. On the bottom side of the photomask 110 are areas 120. The photomask 110 and photoresist 130 are treated with light from a light source (not shown). The light shines through the photomask 110 where there are no areas 120. The light is reflected or absorbed where there are areas 120. Some of the light that passes through the photomask 110 continues through a lens 140, which projects an image of the mask pattern onto the photoresist 130, which undergoes a chemical reaction when exposed to light. Portions of the photoresist 150 are exposed to the light while portions of the photoresist 160 are ideally not exposed to the light.

However, approximately 4–5% of the light is lost through reflections off each of the two surfaces of the photomask, as illustrated by arrows 170 in FIG. 1. When a large number of devices are fabricated on a substrate, this amount of loss is costly for the manufacturer. In addition, light reflected from the substrate can be transmitted back through the lens and back to the photomask 110. A portion of this light is then reflected by the photomask 110 back to the photoresist 160 on the wafer. Such reflected light is not part of the intended image of the photomask 110, and it can degrade the quality of the light pattern in the photoresist 160.

Accordingly, what is needed is a system and method for improving the transmission of light through photomasks. The method and system should decrease the loss of light due to reflections and decrease undesired exposure of portions of the photoresist. The present invention addresses such a need.

SUMMARY OF THE INVENTION

The present invention provides a method and system for improving the transmission of light through a photomask. The method includes providing a photomask substrate, and applying at least one anti-reflection coating to at least one side of the photomask substrate. The anti-reflection coating reduces the loss of light during lithography due to reflections. This increases the efficiency of the lithography. The method and system has the added advantage of reducing the amount of undesired exposure of a photoresist.

DETAILED DESCRIPTION

The present invention relates to a system and method for improving the transmission of light through photomasks. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
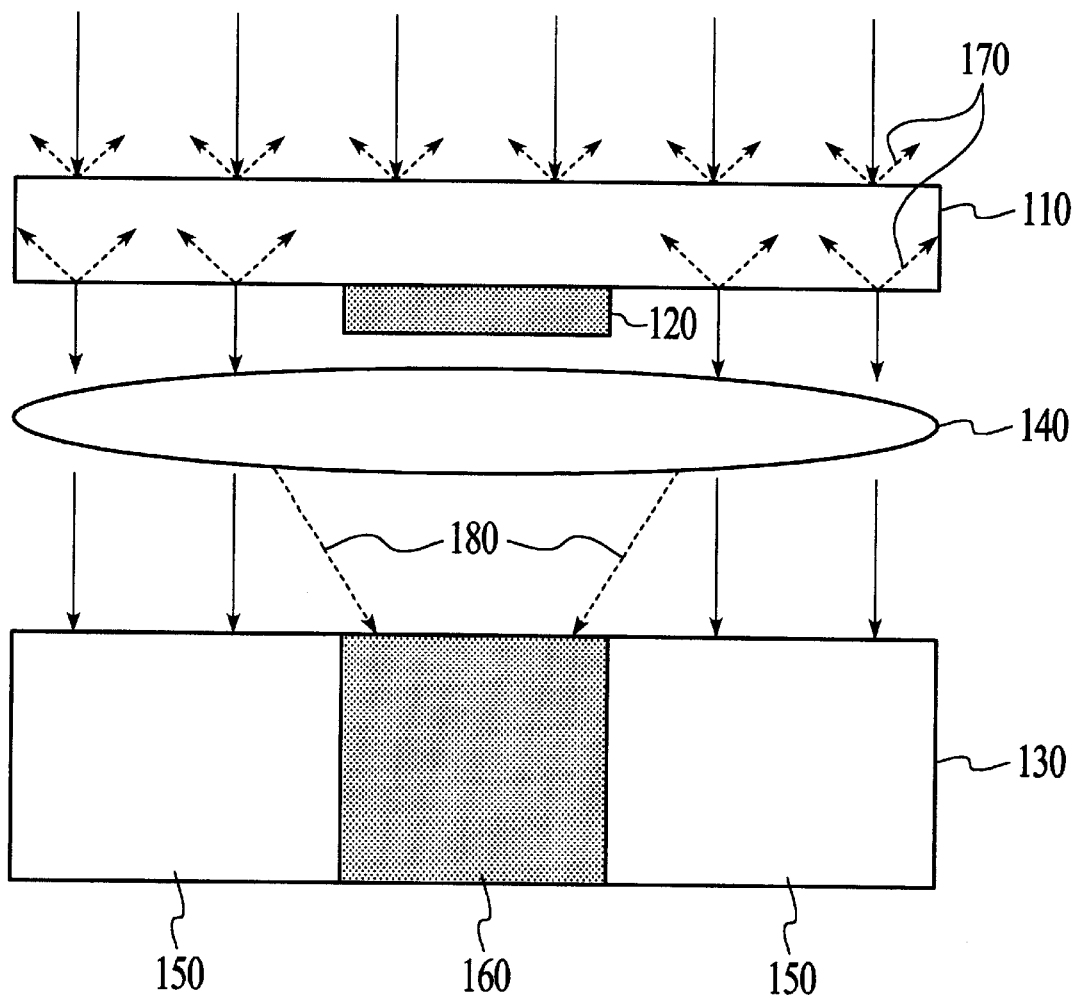
FIG. 1 illustrates a conventional photomask and photoresist as used in lithography.
Figure 2:
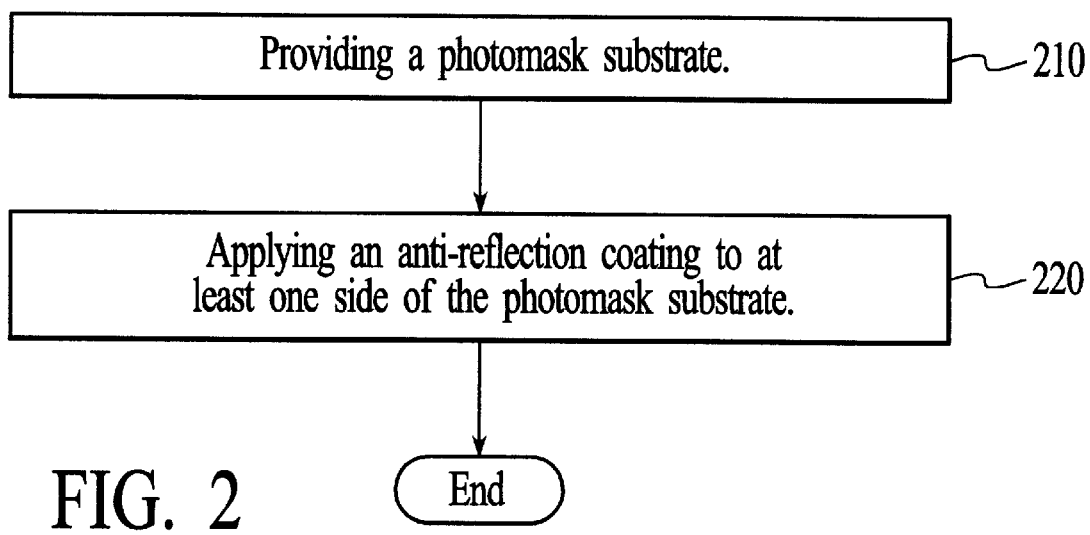
FIG. 2 is a flow chart illustrating a method for improving the transmission of light through photomasks in accordance with the present invention.

FIG. 2 is a flow chart illustrating a method for improving the transmission of light through photomasks in accordance with the present invention. First, a photomask substrate is provided, via step 210. The photomask substrate may be comprised of fused silica or some other material. Then, an anti-reflection coating is applied to at least one side of the photomask substrate, via step 220. An attenuating film may then be applied to one side, forming a photomask blank. The photomask blank is then patterned to form the photomask. Light transmitted through the silica with the anti-reflection coating(s) suffer less loss of light due to reflections. This increases the efficiency of the lithography. The amount of undesired exposure of a photoresist (not shown) is decreased as well. The anti-reflection coating can be a single film, usually comprised of materials, such as $CaF_2$, $MgF_2$, $DyF_3$, $LaF_3$, $Na_3AlF_6$, $YF_3$, and $AIM_2O_3$, although not limited to these materials. The anti-reflection coating may also be a multilayer film comprised of these and other materials, sometimes along with $SiO_2$.

The reflection from light normally incident on a thick planar material is given by:

$$R = \left(\frac{n-1}{n+1}\right)^2$$

where n is the index of refraction of the material. For fused silica, n=1.5–1.7 for wavelengths between 248 nm and 157 nm, which is the wavelength range of interest for lithography. Accordingly, the reflection from a single surface of the fused silica is 4%–7%. In a lithography application, between 8% and 14% of the light is lost from simple reflections from the two surfaces of the photomask. The application of anti-reflection coating(s) can reduce this reflectance to less than 0.5% per surface. This can enhance lithography productivity significantly.

For a single anti-reflecting film, the relationship between the thickness of the film d, the wavelength of the light λ, and the index of refraction n of the material is given by the formula below, where k is a non-negative integer:

$$d = \frac{(2k+1)\lambda}{4n}$$

Figure 3:
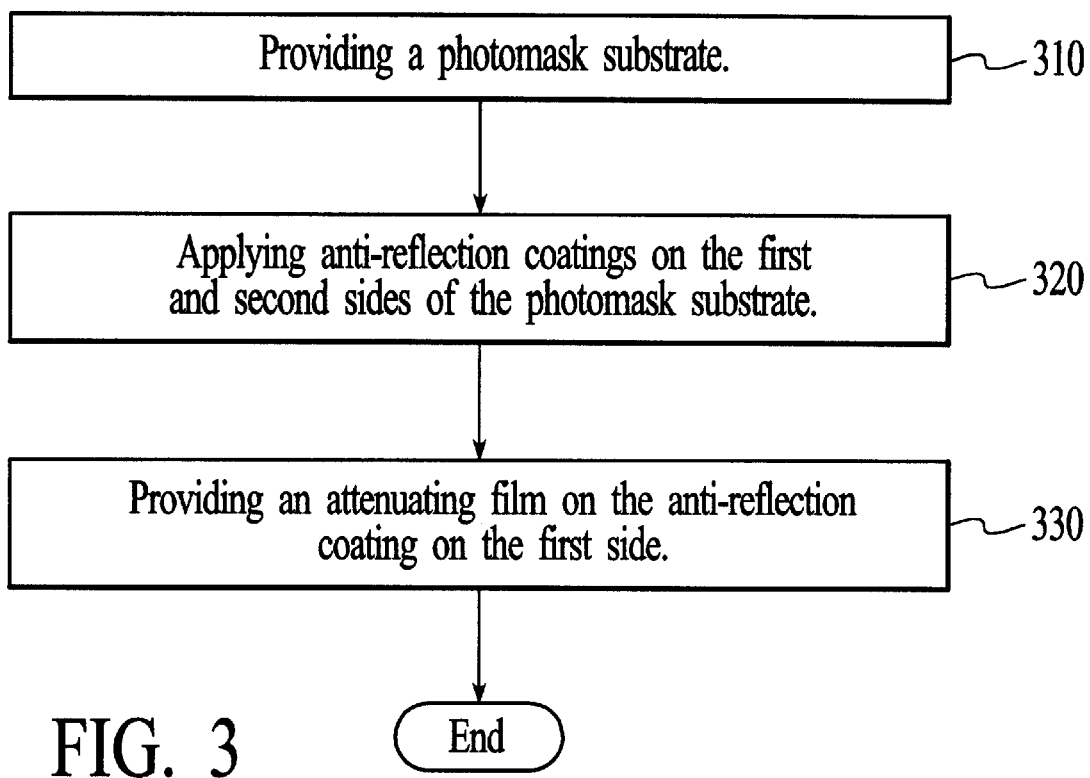
FIG. 3 is a flow chart illustrating a first preferred embodiment of the method for improving the transmission of light through photomasks in accordance with the present invention.
Figure 4:
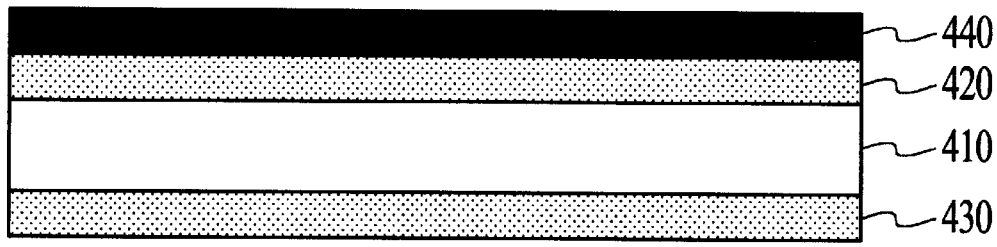
FIG. 4 illustrates a photomask blank provided by the first preferred embodiment of the method illustrated in FIG. 3 in accordance with the present invention.

FIG. 3 is a flow chart illustrating a first preferred embodiment of the method for improving the transmission of light through photomasks in accordance with the present invention. FIG. 4 illustrates a photomask blank provided by the first preferred embodiment of the method as illustrated in FIG. 3. First, a photomask substrate 410 is provided, via step 310. The photomask substrate 410 may be comprised of fused silica and has a first (top) side and a second (bottom) side. Anti-reflection coatings 420 and 430 are applied to the first and second sides of the photomask substrate 410 respectively, via step 320. Then, an attenuating or opaque film 440 may be provided on top of the anti-reflection coating 420 on the first side, via step 330. The attenuating film 440 is patterned in correspondence to the desired circuitry for the device. In the first preferred embodiment, reflections from both sides of the photomask are decreased.

Figure 5:
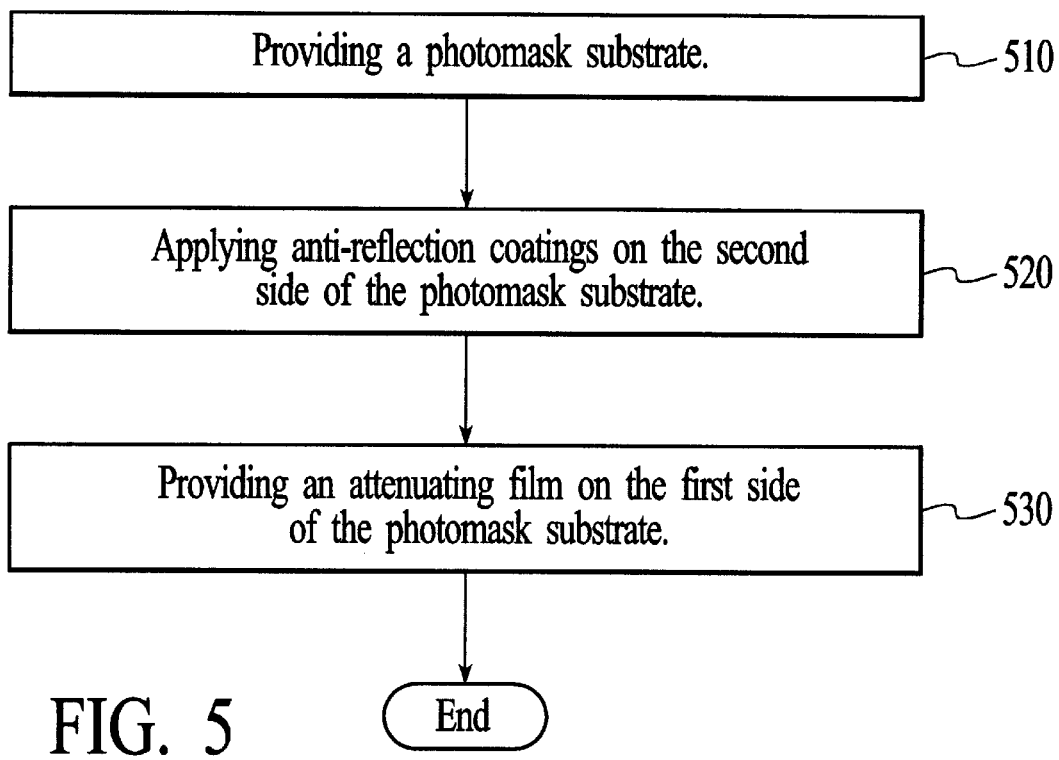
FIG. 5 is a flow chart illustrating a second preferred embodiment of the method for improving the transmission of light through photomasks in accordance with the present invention.
Figure 6:
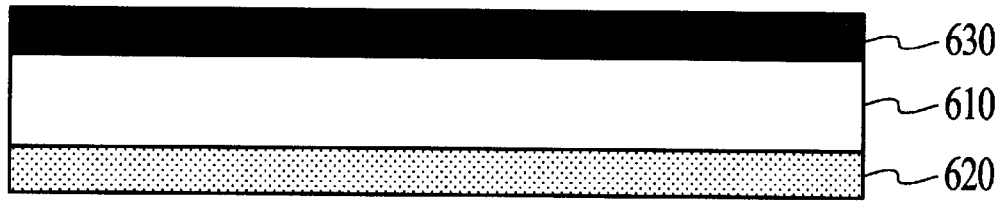
FIG. 6 illustrates a photomask blank provided by the second preferred embodiment of the method illustrated in FIG. 5 in accordance with the present invention.

However, there may be an occasion where the anti-reflection coating is not compatible with the etching of the attenuating film. In this situation, the second preferred embodiment of the present invention, as illustrated in FIGS. 5 and 6, may be used. FIG. 5 is a flow chart illustrating a second preferred embodiment of the method for improving the transmission of light through photomasks in accordance with the present invention. FIG. 6 illustrates a photomask blank provided by the second preferred embodiment of the method as illustrated in FIG. 5. First, a photomask substrate 610 is provided, via step 510. An anti-reflection coating 620 is applied to the second side of the photomask substrate 610, via step 520. Then, an attenuating film 630 is provided on the first side of the photomask substrate 610, via step 530. In the second preferred embodiment, the integrity of the attenuating film 630 is maintained while reflections from the second side of the photomask substrate 610 are decreased. The efficiency of the lithography is still improved over conventional photomasks with the second preferred embodiment.

Figure 7:
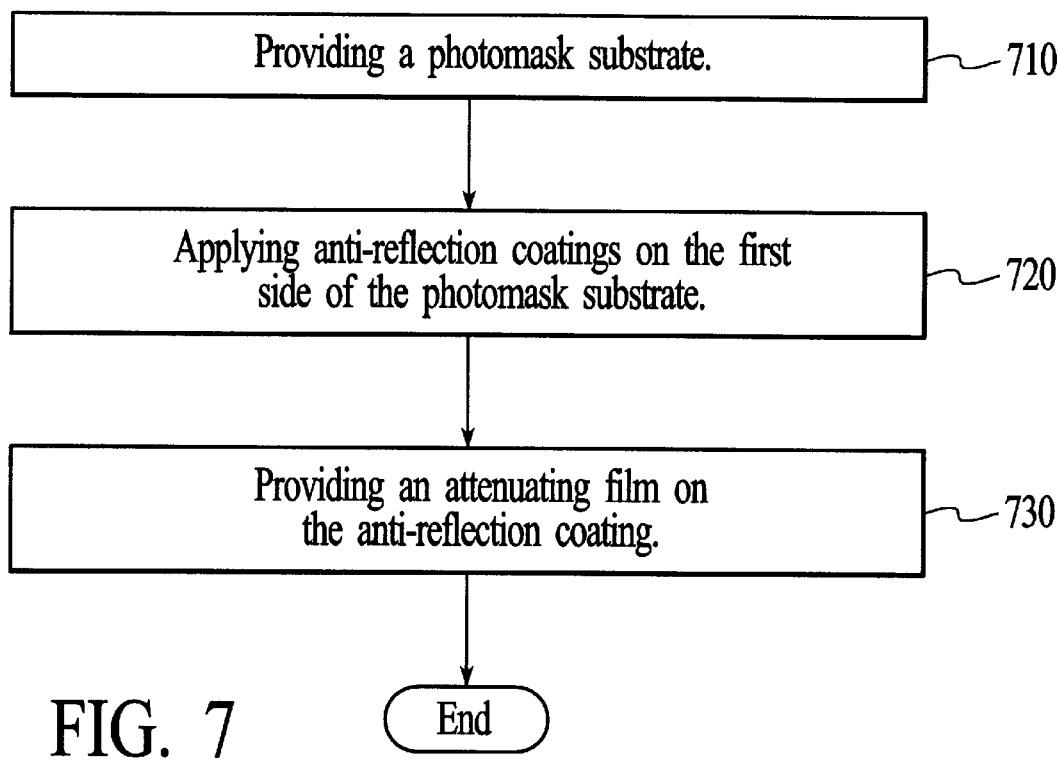
FIG. 7 is a flow chart illustrating a third preferred embodiment of the method for improving the transmission of light through photomasks in accordance with the present invention.
Figure 8:
FIG. 8 illustrates a photomask blank provided by the third preferred embodiment of the method illustrated in FIG. 7 in accordance with the present invention.

There may also be an occasion where there is concern about the scratching of the anti- reflection coating which is applied to the second side of the photomask. Typically, the scratching of the second side of the photomask is not a concern due to the hardness of the silica. However, the anti-reflection coating is easily scratched during the handling of the photomask. In this occasion, the third preferred embodiment of the present invention, as illustrated in FIGS. 7 and 8, may be used. FIG. 7 is a flow chart illustrating a third preferred embodiment of the method for improving the transmission of light through photomasks in accordance with the present invention. FIG. 8 illustrates a photomask blank provided by the third preferred embodiment of the method as illustrated in FIG. 7. First, a photomask substrate 810 is provided, via step 710. An anti-reflection coating 820 is applied to the first side of the photomask substrate 810, via step 720. Then, an attenuating film 830 may be provided on the anti-reflection coating 820, via step 730. In the third preferred embodiment, reflections from the first side of the photomask substrate 810 are decreased. Because there is no anti-reflection coating on the second side, there is no cause for concern about scratching the coating. The efficiency of the lithography is still improved over conventional photomasks with the third preferred embodiment.

Figure 9:
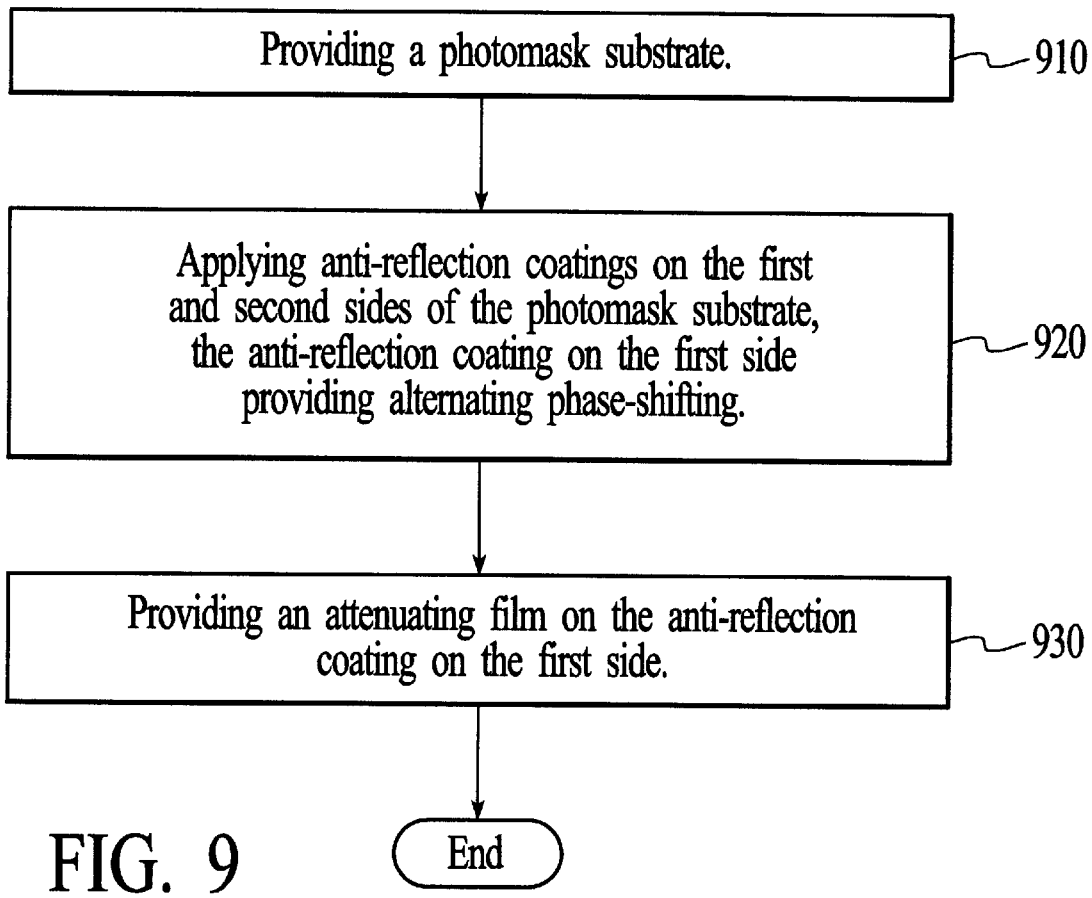
FIG. 9 is a flow chart illustrating a fourth preferred embodiment of the method for improving the transmission of light through photomasks in accordance with the present invention.
Figure 10:
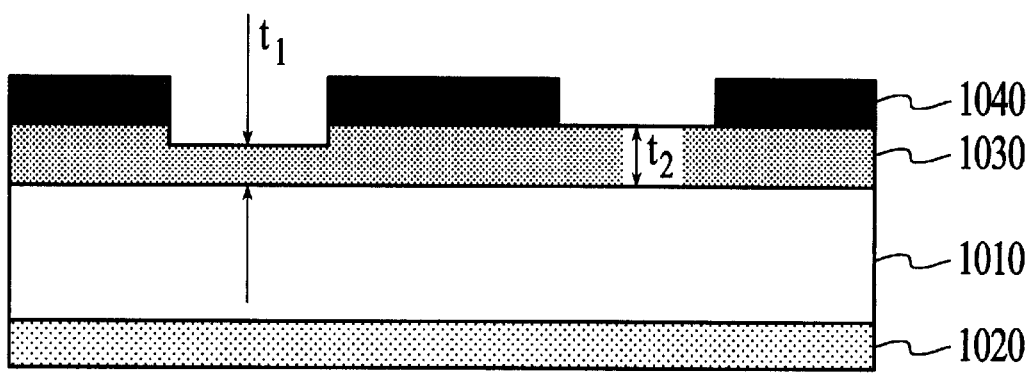
FIG. 10 illustrates a photomask blank provided by the fourth preferred embodiment of the method illustrated in FIG. 9 in accordance with the present invention.

The method and system in accordance with the present invention may also be used for alternating phase-shifting photomasks, as illustrated in FIGS. 9 and 10. Alternating phase-shifting photomasks are well known in the art and will not be discussed in detail here. FIG. 9 is a flow chart illustrating a fourth preferred embodiment of the method for improving the transmission of light through photomasks in accordance with the present invention. FIG. 10 illustrates a photomask provided by the fourth preferred embodiment of the method as illustrated in FIG. 9. First, a photomask substrate 1010 is provided, via step 910. Anti-reflection coatings 1020 and 1030 are applied to the first and second sides of the photomask substrate 1010 respectively, via step 920. The anti-reflecting coating 1030 also serves as the alternating phase-shifting film. Then, an attenuating film 1040 may be provided on the alternating phase-shifting film 1030, via step 930. In the fourth preferred embodiment, the alternating phase-shifting film 1030 provides anti-reflection capabilities and 1800 phase-shifting to the light. This is accomplished by satisfying the following equations:

$$t_1 = \frac{(2m+1)\lambda}{4n}$$

$$t_2 - t_1 = \frac{(2k+1)\lambda}{4n}$$

$$= \frac{\lambda}{2(n-1)}$$

where m and k are non-negative integers, and n is the index of refraction of the alternating phase-shifting film 1030. $t_1$ and $t_2$ are the thickness of the alternating phase-shifting film 1030 beside the attenuating film 1040 as illustrated in FIG. 10. The area with $t_2$ thickness is a zero phase shifting area while the area with $t_1$ thickness is a 180° phase shifting area. From the last two equations, the following result is obtained:

$$n = \frac{2k+1}{2k-1}$$

When k=3, n=1.4. This can be approximately satisfied with light at 157 nm wavelength for $MgF_2$ (n=1.47) and LiF (n=1.49).

A method and system for improving the transmission of light through photomasks has been disclosed. The method and system applies at least one anti-reflection coating to a side of the photomask. The anti-reflection coating reduces the loss of light during lithography due to reflections. This increases the efficiency of the lithography. The method and system, with the exception of the second embodiment, has the added advantage of reducing the amount of undesired exposure of a photoresist due to scatter.

Although the present invention has been described in accordance with the embodiments shown, one of ordinary skill in the art will readily recognize that there could be variations to the embodiments and those variations would be within the spirit and scope of the present invention. Accordingly, many modifications may be made by one or ordinary skill in the art without departing from the spirit and scope of the appended claims.

What is claimed is:

1. A method for transmission of light through a photomask, comprising the steps of:

(a) providing a photomask substrate; and (b) providing an attenuating film on a first side of the photomask substrate, and applying at least one anti-reflection coating to the first side of the photomask substrate, wherein a reflection of the light from the photomask substrate is reduced and (c) providing a pattern on the attenuating film and the at least one anti-reflection coating, wherein no attenuating film or anti-reflection coating is applied on the pattern.

2. The method of claim 1, wherein the providing step (a) comprises:

(a1) providing a fused silica.

3. The method of claim 1, wherein the applying step (b) comprises:

(b1) applying the at least one anti-reflection coating on the first side of the photomask substrate; and (b2) providing the attenuating film on the at least one anti-reflection coating.

4. (Twice Amended) The method of claim 1, wherein the applying step (b) comprises:

(b1) applying a first anti-reflection coating on the first side of the photomask substrate, the first anti-reflection coating providing alternating phase-shifting;

(b2) applying a second anti-reflection coating on a second side of the photomask substrate; and (b3) providing the attenuating film on the first anti-reflection coating.

5. A system, comprising:

a photomask substrate;

an attenuating film on a first side of the photomask substrate; and at least one anti-reflection coating on the first side of the photomask substrate, wherein a reflection of light from the photomask substrate is reduced; and a pattern on the attenuating film and the at least one anti-reflection coating, wherein no attenuating film or anti-reflection coating is applied on the pattern.

6. The system of claim 5 wherein the at least one anti-reflection coating comprises:

a first anti-reflection coating on a first side of the photomask substrate; and a second anti-reflection coating on a second side of the photomask substrate.

7. A method for transmission of light through a photomask, comprising the steps of:

(a) providing a photomask substrate;

(b) applying a first anti-reflection coating to a first side of the photomask substrate;

(c) applying a second anti-reflection coating to a second side of the photomask substrate, wherein a reflection of the light from the photomask substrate is reduced;

(d) providing an attenuating film on the first anti-reflection coating; and (e) providing a pattern on the first anti-reflection coating and the attenuating film wherein no attenuating film or anti-reflection coating is applied to the pattern.

8. A method for transmission of light through a photomask, comprising the steps of:

(a) providing a photomask substrate;

(b) applying a first anti-reflection coating on a first side of the photomask substrate, the first anti-reflection coating providing alternating phase-shifting;

(c) applying a second anti-reflection coating on a second side of the photomask substrate;

(d) providing an attenuating film on the alternating phase-shifting film, wherein a reflection of the light from the photomask substrate is reduced; and (e) providing a pattern on the alternating phase-shifting film and the attenuating film, wherein no anti-reflection coating or attenuating film is applied on the pattern.

9. A system, comprising:

a photomask substrate;

a first anti-reflection coating on a first side of the photomask substrate; and a second anti-reflection coating on a second side of the photomask substrate, wherein a reflection of a light from the photomask substrate is reduced;

an attenuating film on the first anti-reflection coating and a pattern on the first anti-reflection coating and the attenuating film, wherein no anti-reflection coating or attenuating film is applied on the pattern.

10. A system, comprising:

a photomask substrate;

a first anti-reflection coating on a first side of the photomask substrate, the first anti-reflection coating providing alternating phase-shifting;

a second anti-reflection coating on a second side of the photomask substrate;

an attenuating film on the first anti-reflection coating, wherein a reflection of a light from the photomask substrate is reduced; and a pattern on the alternating phase shifting film and the attenuating film, wherein no anti-reflection coating or attenuating film is applied on the pattern.

* * * * *